(12) United States Patent
Murata et al.

(10) Patent No.: US 7,109,133 B2
(45) Date of Patent: Sep. 19, 2006

(54) SEMICONDUCTOR CHIP MOUNTING APPARATUS AND METHOD OF MOUNTING SEMICONDUCTOR CHIPS USING THE SAME

(75) Inventors: Noriyuki Murata, Ishikawa-ken (JP); Seiichi Yoshimura, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 10/728,927

(22) Filed: Dec. 8, 2003

(65) Prior Publication Data
US 2004/0172815 A1 Sep. 9, 2004

(30) Foreign Application Priority Data
Mar. 5, 2003 (JP) ............. 2003-057987

(51) Int. Cl.
*H01L 21/00* (2006.01)
(52) U.S. Cl. ............................... 438/800
(58) Field of Classification Search ............ 414/749.1, 414/749.3
See application file for complete search history.

(56) References Cited

U.S. PATENT DOCUMENTS

| | | | |
|---|---|---|---|
| 5,035,047 A * | 7/1991 | Harigane et al. ............ 29/740 |
| 5,084,959 A * | 2/1992 | Ando et al. .................. 29/740 |
| 5,839,187 A * | 11/1998 | Sato et al. ................... 29/743 |
| 6,152,679 A * | 11/2000 | Araya et al. ............. 414/751.1 |
| 6,519,840 B1 | 2/2003 | Stalder |
| 6,811,627 B1 * | 11/2004 | Arai et al. ..................... 156/64 |
| 6,836,959 B1 * | 1/2005 | Watanabe et al. ............ 29/740 |

FOREIGN PATENT DOCUMENTS

| | | |
|---|---|---|
| JP | 2-174132 | 7/1990 |
| JP | 4-28239 | 1/1992 |
| JP | 4-124841 | 4/1992 |
| JP | 2000-252305 | 9/2000 |

* cited by examiner

*Primary Examiner*—Scott B. Geyer
(74) *Attorney, Agent, or Firm*—Oblon, Spivak, McClelland, Maier & Neustadt, P.C.

(57) ABSTRACT

Semiconductor chip mounting apparatus 90 is provided with semiconductor chip supply unit 10, semiconductor chip carrier unit 20, lead frame carrier unit 30, sensor unit 60 and a control unit 70. Semiconductor chip carrier unit 20 picks up a semiconductor chip 3 from semiconductor chip supply unit 10 and carries the same to mounting position 50 of lead frame 31 and mounts it on mounting position 50. Sensor unit 60 measures first and second positions of semiconductor chip carrier unit 20 before and during mounting operations, respectively. Control unit 70 compares the first position of semiconductor chip carrier unit 20 with the second one of semiconductor chip carrier unit 20 and calculates position deviations. Control unit 70 further provides position adjustment instructions when the position deviations are greater than a predetermined value thereby to improve the throughput and precision of semiconductor chip mounting apparatus 90.

5 Claims, 10 Drawing Sheets

SEMICONDUCTOR CHIP MOUNTING APPARATUS AND METHOD OF MOUNTING SEMICONDUCTOR CHIPS USING THE SAME

FIELD OF THE INVENTION

This invention relates to a semiconductor chip mounting apparatus used in a semiconductor manufacturing process and a method of mounting semiconductor chips employing such an apparatus.

BACKGROUND OF THE INVENTION

As semiconductors with higher performance and greater integration have been recently developed, market demands for their cost reduction have been stronger. Production lines to assemble such semiconductors require semiconductor chip mounting apparatus with higher throughput and higher precision.

A prior art semiconductor chip mounting apparatus will be described below with reference to FIGS. 9–11 (also see, for example, Patent Publication 1: Japanese Patent Disclosure No. 2000-252305).

FIG. 9 is a perspective view of a semiconductor chip mounting apparatus, FIG. 10 is a schematic operation diagram, and FIG. 11 is a perspective view of a semiconductor chip mounted on a lead frame after the completion of a semiconductor chip mounting process.

As shown in FIG. 9, semiconductor chip mounting apparatus 100 includes semiconductor chip carrier unit 120 and lead frame carrier unit 130. Semiconductor chip carrier unit 120 carries silicon chips 113 from semiconductor chip supply unit 110 to mounting position 150 of tape-like lead frame 131 sent by lead frame carrier unit 130. Lead frame 131 has a predetermined pattern to receive silicon chip 113 at mounting position 150.

Semiconductor chip supply unit 110 is provided with wafer ring 115. Wafer ring 115 is supported by supporting member 114 so that diced silicon wafer 112 lined with dicing sheet 111 can be separated into silicon chips 113 at the time when dicing sheet 111 is expanded. Semiconductor chip supply unit 110 is movable in X1- and Y1-directions to place chips at picking-up position 140 of semiconductor chip carrier unit 120 before starting mounting operations as set forth below.

Semiconductor chip carrier unit 120 is provided with arm 121 that moves to the right and left X1, front and rear Y1, and up and down Z1. Arm 121 includes collet holding unit 122 to the edge of which sucking member 124 is attached. Collet 123 is defined at the low end of sucking member 124 to suck and hold silicon chip 113.

Collet 123 goes and returns along carrier paths y and z as shown in chain lines as arm 121 moves back and forth, and up and down. Lead frame 131 is carried to mounting position 150 of silicon chip 113 by lead frame carrier unit 130 so that silicon chip 113 is mounted on lead frame 131 by arm 121.

As shown in FIGS. 9–11, the semiconductor chip mounting apparatus carries out the following assembling steps. First, semiconductor chip carrier unit 120 is moved to picking-up position 140 and one chip is sucked and held by sucking member 124 from separated silicon chips 113.

Subsequently, semiconductor chip carrier unit 120 is moved to mounting position 150 of lead frame 131 to mount this chip 113 on lead frame 131. Here, since lead frame 131 is heated in advance at a predetermined temperature, silicon chip 113 is fixed on lead frame 131 with an adhesive provided on the back of silicon chip 113.

After being mounted and fixed on lead frame 131, position data of silicon chip 113 at the beginning of mounting, during the mounting and after the completion of mounting are regularly checked as to whether the position data are in predetermined coordinates (X, Y, θ). If the position data are not within a prescribed tolerance, the positions of collet 123 and arm 121 are finely adjusted to optimize picking-up and mounting positions 140 and 150 of semiconductor chip carrier unit 120.

[Prior Art Patent Publication 1] Japanese Patent Disclosure No. 2000-252305 (Page 5 and FIG. 4)

The semiconductor chip mounting apparatus set forth above achieves a high speed operation time of 0.1–0.5 seconds from picking-up one silicon chip 113 to mounting the same on lead frame 131 to reduce its assembling process cost.

With shorter mounting time of silicon chip 113, the temperature of semiconductor chip carrier unit 120 is higher by several tens of degrees than that before such assembling steps and metallic portions of semiconductor chip carrier unit 120 becomes thermally expanded. As a result, picking-up and mounting positions 140 and 150 of semiconductor chip carrier unit 120 are discrepant from those before the mounting step, and mounted silicon chip 113 also deviates from its correct position.

In order to adjust such discrepancies, semiconductor chip mounting apparatus 100 must be tentatively stopped for the adjustment of picking-up and mounting positions of semiconductor chip carrier unit 120. This results in a decline in the throughput of mounting operations.

SUMMARY OF THE INVENTION

An object of the present invention is to provide a semiconductor chip mounting apparatus with high throughput of mounting operations and a method of mounting semiconductor chips by using the same.

According to a first aspect of the present invention, a semiconductor chip mounting apparatus is characterized in that a semiconductor chip supply unit supplies semiconductor chips, a mounting material carrier unit carries a mounting material, a semiconductor chip carrier unit carries a semiconductor chip picked up from the semiconductor chip supply unit to a mounting position where the semiconductor chip is mounted on the mounting material, a sensor unit measures a position of the semiconductor chip carrier unit, a position adjustment unit adjusts a position of the semiconductor chip carrier unit, and a control unit compares position data of the semiconductor chip carrier unit measured by the sensor unit before mounting operations with those measured by the same during the mounting operations in order to instruct the position adjustment unit of position adjustment data if difference in position detected by the sensor unit is greater than a predetermined value.

According to a second aspect of the present invention, a semiconductor chip mounting apparatus is characterized in that a semiconductor chip supply unit supplies semiconductor chips, a lead frame carrier unit carries a lead frame, a semiconductor chip carrier unit carries a semiconductor chip picked up from the semiconductor chip supply unit to a mounting position where the semiconductor chip is mounted on the mounting material, a sensor unit measures a position of the semiconductor chip carrier unit, a position adjustment unit adjusts a position of the semiconductor chip carrier unit, and a control unit compares position data of the semiconductor chip carrier unit measured by the sensor unit before mounting operations with those measured by the same during the mounting operations in order to instruct the position adjustment unit of position adjustment data if difference in position detected by the sensor unit is greater than a predetermined value.

According to another aspect of the present invention, a method of mounting a semiconductor chip is characterized in measuring position data of a semiconductor chip carrier unit by a sensor in a control unit before mounting operations by the semiconductor chip carrier unit, storing the position data measured by the sensor, moving the semiconductor chip carrier unit to a picking-up position to pick up a semiconductor chip from a semiconductor chip supply unit, carrying the semiconductor chip picked up to a mounting position of a lead frame in a lead frame carrier unit to mount the semiconductor chip on the lead frame, measuring a position of the semiconductor chip carrier unit during the mounting operations by the sensor to store the same in the control unit, comparing position data of the semiconductor chip carrier unit measured by the sensor unit before the mounting operations with those measured by the same during the mounting operations to calculate a difference between them, and adjusting picking-up and mounting positions of the semiconductor chip carrier unit if the difference is greater than a predetermined value.

This patent application is based upon and claims the benefit of priority from the Japanese Patent Application No. 2003-57987, filed on Mar. 5, 2003, the entire contents of which are incorporated herein by reference.

BRIEF DESCRIPTION OF THE DRAWINGS

A more complete appreciation of the present invention and many of the attendant advantages thereof will be readily obtained as the same becomes better understood by reference to the following detailed descriptions when considered in connection with the accompanying drawings, wherein.

EMBODIMENTS

Embodiments of the present invention will be explained with reference to the attached drawings.

FIRST EMBODIMENT

Figure 1:
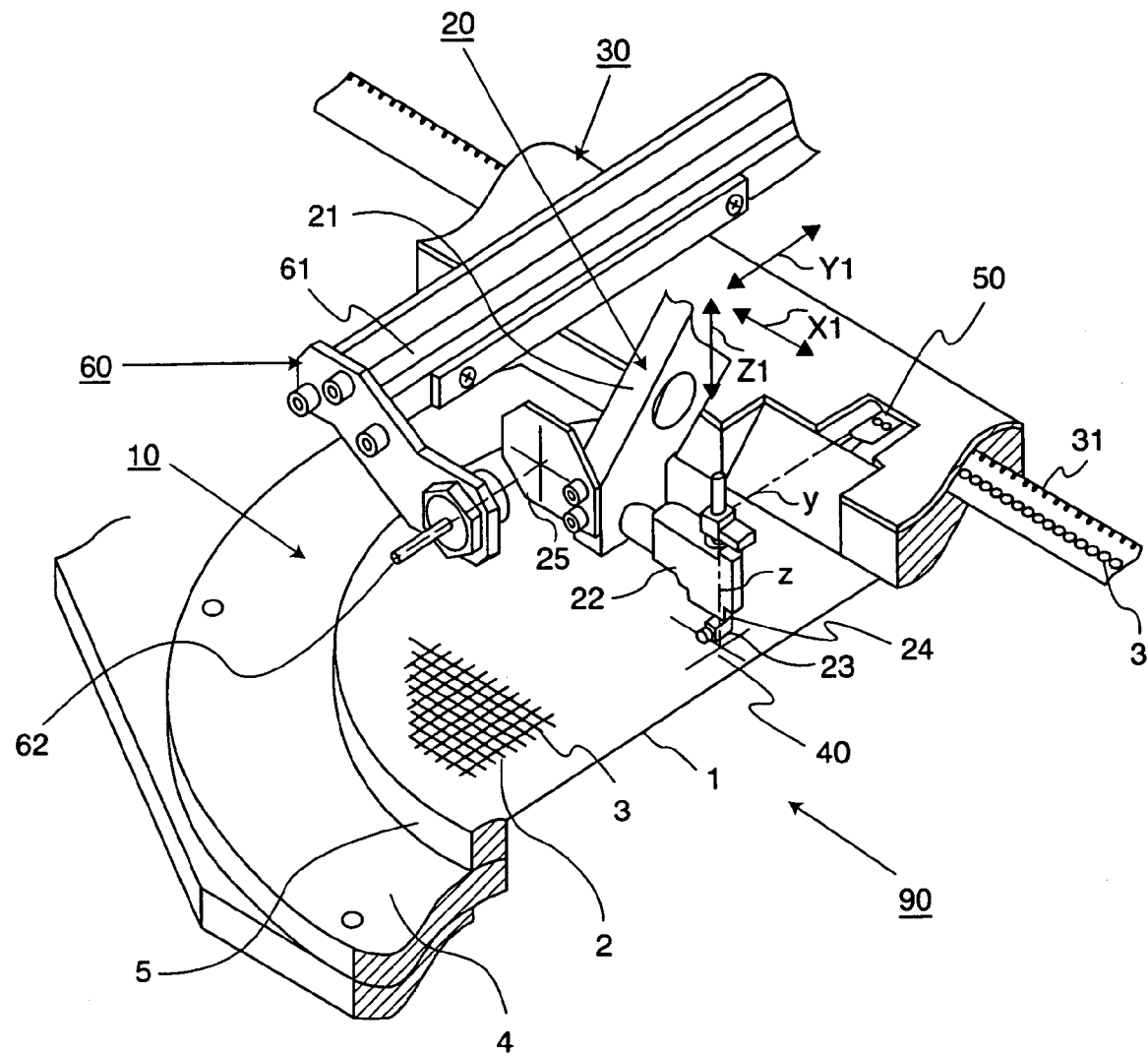
FIG. 1 is a perspective view of a semiconductor chip mounting apparatus in accordance with a first embodiment of the present invention.
Figure 2:
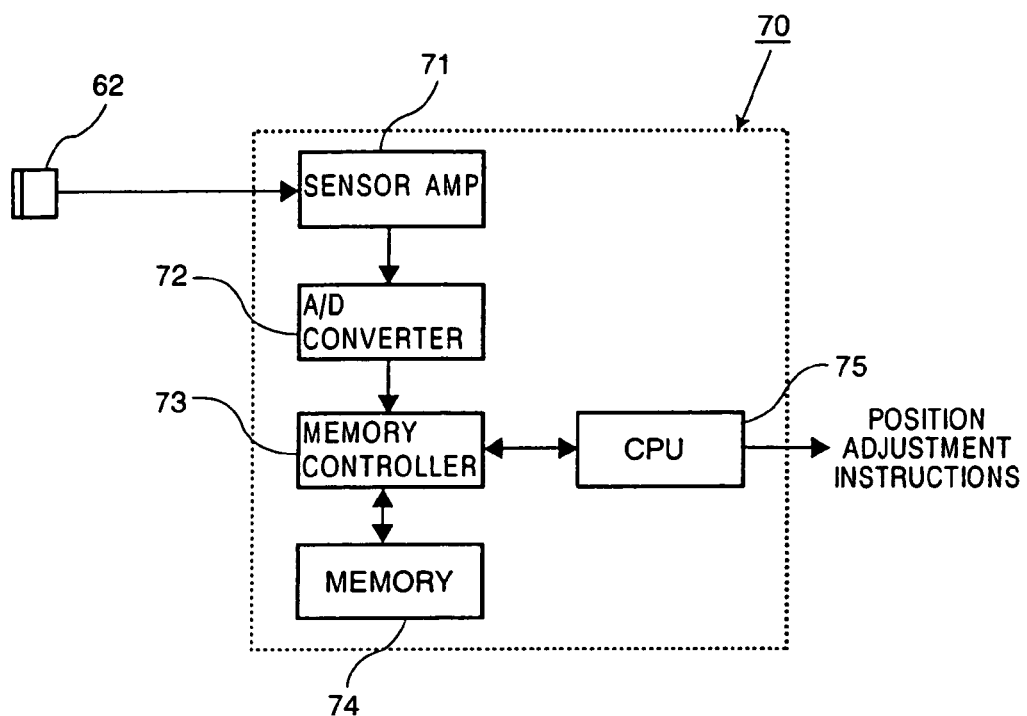
FIG. 2 is a block diagram of a control unit of the semiconductor chip mounting apparatus shown in FIG. 1.
Figure 3:
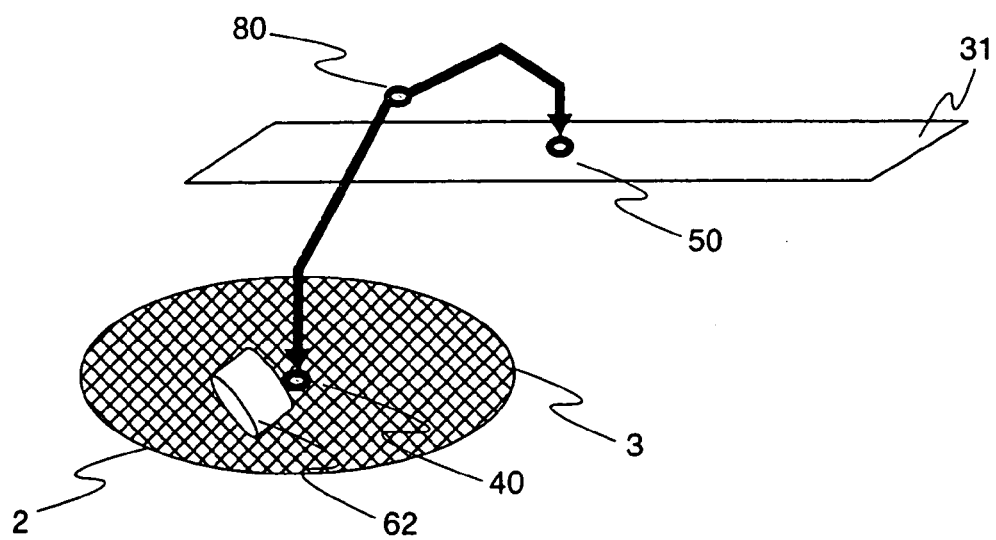
FIG. 3 is a schematic operation diagram of the semiconductor chip mounting apparatus shown in FIG. 1.
Figure 4:
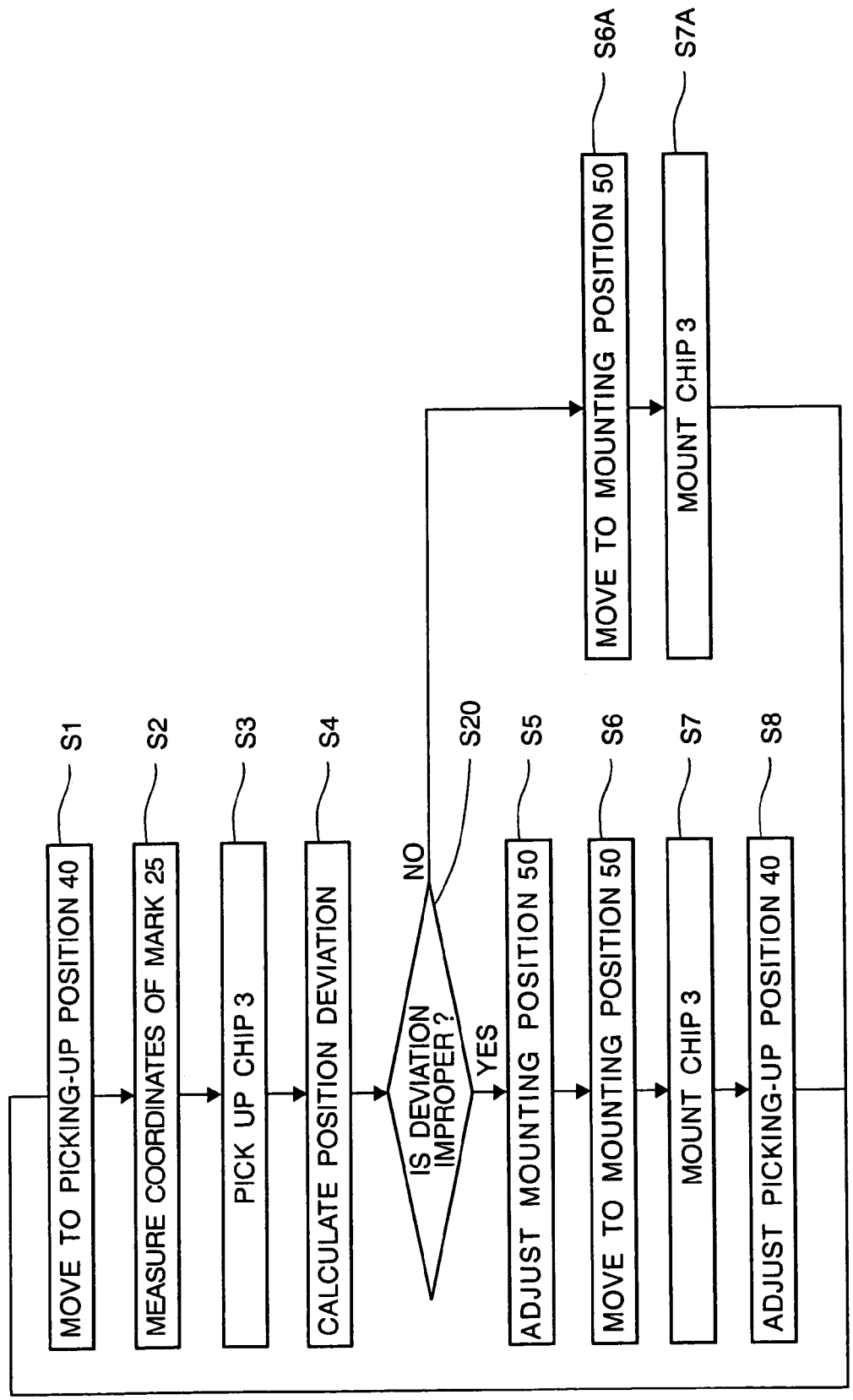
FIG. 4 is an operation flow chart of the semiconductor chip mounting apparatus shown in FIG. 1.

With reference to FIGS. 1–4 a semiconductor chip mounting apparatus in accordance with a first embodiment of the present invention and a method of mounting a semiconductor chip using the same will be explained below. FIG. 1 is a perspective view of the semiconductor chip mounting apparatus, FIG. 2 is a block diagram of a control unit of the semiconductor chip mounting apparatus, and FIGS. 3 and 4 are a schematic operation diagram of the semiconductor chip mounting apparatus and its operation flow chart, respectively.

As shown in FIGS. 1 and 2, the semiconductor chip mounting apparatus 90 is provided with semiconductor chip supply unit 10, semiconductor chip carrier unit 20, lead frame carrier unit 30, sensor unit 60 and control unit 70. Semiconductor chip carrier unit 20 carries silicon chips 3 to the mounting position of tape-like lead frame 31 forwarded by lead frame carrier unit 30. Lead frame 31 has a predetermined pattern to receive silicon chips 3.

Semiconductor chip supply unit 10 is supported by supporting member 4 to separate silicon chips 3 from each other in the case that dicing sheet 1 is expanded. For that purpose, dicing sheet 1 held on wafer ring 5 is prepared to back diced silicon wafer 2. Semiconductor chip supply unit 10 is movable in X1- and Y1-directions to set silicon chips 3 at picking-up position 40 of semiconductor chip carrier unit 20 before mounting operations are started as set forth later.

Semiconductor chip carrier unit 20 is provided with arm 21 that is movable in the directions of right or left X1, forward or backward Y1 and up or down Z1 as shown by solid lines with arrows, respectively, by a driving mechanism. Arm 21 is assembled with collet holding unit 22 and position measuring mark 25. Collet holding unit 22 has sucking member 24 at its edge. Sucking member 24 is provided with collet 23 at its lower edge portion so that silicon chip 3 is sucked and held by sucking member 24.

Position measuring mark 25 is provided for sensor unit 60 to measure picking-up and mounting positions 40 and 50 of semiconductor chip carrier unit 20.

As arm 21 moves forward or backward, and up or down, the edge of collet 23 moves reciprocally along carrying paths "y" and "z" shown in dotted chain lines to carry silicon chip 3 to, and to mount it on, the mounting position of lead frame 31 advanced by lead frame carrier unit 30. Since lead frame 31 is previously heated at a predetermined temperature and an adhesive is provided on the back of lead frame 31, silicon chip 3 is fixed on lead frame 31.

Instead of previously heating lead frame 31 as set forth above, where an adhesive, such as silver (Ag) paste, is provided on the back of lead frame 31, silicon chip 3 may be fixed on lead frame 31 at a normal temperature.

Displacement sensor unit 60 includes displacement sensor 62 to measure a position of position measuring mark 25 of semiconductor chip carrier unit 20, and sensor holder 61 to hold displacement sensor 62. This displacement sensor 62 is a laser sensor and is provided with a semiconductor laser light source to irradiate laser light to position measuring mark 25, condenser lens to collect laser light reflecting from position measuring mark 25 and a charge coupled device to convert collected light into analog electrical signals.

An ultrasound, eddy current or optical type non-contact sensor or a contact sensor may be used for displacement sensor 62.

As shown in FIG. 2, information of picking-up and mounting positions for semiconductor chip carrier unit 20 detected by displacement sensor 62 is supplied to control unit 70. This control unit 70 includes a sensor amplifier 71, analog-to-digital (A/D) converter 72, memory controller 73, memory 74 and central processing unit (CPU) 75. Weak analog position signals obtained from displacement sensor 62 are amplified by sensor amplifier 71. Output signals of sensor amplifier 71 are converted into digital signals by A/D converter 72 that, in turn, are stored in, and read out from, memory 74 in response to writing and reading instructions from memory controller 73, respectively. Position data before mounting operations start are compared with those during such mounting operations and position adjustment instructions (based on position adjustment control signals) are launched by CPU 75 in the case that differences between the compared position data are greater than a predetermined tolerance.

Next, mounting operations of the semiconductor chip mounting apparatus will be explained below. With reference to FIGS. 1 and 3, preparations for continuous mounting operations (before commencement of mounting operations) are as follows. Silicon chips 3 are individually and separately put on dicing sheet 1. Wafer ring 4 holding dicing sheet 1 is set on supporting member 4. Picking-up and mounting positions 40 and 50 of semiconductor chip carrier unit 20 are set up. Picking-up position 40 of semiconductor chip carrier unit 20 is measured by displacement sensor 62. Position data measured by displacement sensor 62 are stored in memory 74. The origin 80 is defined as a starting point of the mounting operations at the position that semiconductor chip mounting apparatus 90 stops.

After such preparations, continuous mounting operations are commenced.

As shown in FIGS. 1–4, collet 23 of semiconductor chip carrier unit 20 is moved from the origin 80 to picking-up position 40 (Step S1). In this situation, coordinates at a position of position measuring mark 25 of semiconductor chip carrier unit 20 are measured by displacement sensor 62 of displacement sensor unit 60. More concretely, laser beams are irradiated to position measuring mark 25. Laser beams reflected from position measuring mark 25 are collected to be converted to analog electric signals. The analog electrical signals are further converted to digital electrical signals, which are then stored as position data of picking-up position 40 in control unit 70 (Step S2).

Next, silicon chip 3 is sucked and held, i.e., picked up by sucking member 24 (Step S3). Measured data of picking-up position 40 are compared with those of the reference position, i.e., picking-up position 40 of semiconductor chip carrier unit 20 before the mounting operations and a difference between them is calculated by CPU 75 of control unit 70 (Step S4).

It is checked whether the difference from the reference position (i.e., deviation from the correct picking-up position) is greater than a predetermined value or not (Step S20). Where the difference is less than the predetermined value, no adjustment of the mounting position is made so that semiconductor chip carrier unit 20 is moved to mounting position 50 (Step S6A) and silicon chip 3 is mounted on lead frame 31 (Step S7A).

Semiconductor chip carrier unit 20 is then moved to picking-up position 40 to commence anew the first operation (Step S1). A series of the steps set forth above are repeated to carry out the continuous mounting operations.

A picking-up position deviation may be due to thermal expansion of metallic members of semiconductor chip carrier unit 20 during the continuous mounting operations. Control operations will be explained below with respect to such a position deviation. The thermal expansion of the metallic members of semiconductor chip carrier unit 20, such as arm 21, takes place mainly in Y1-direction. Thus, arm 21 is expanded in Y1-direction so that the position deviation from the picking-up position measured during the preparations is also caused in that direction.

Where the position deviation is greater than the predetermined value in Step S4 and semiconductor chip carrier unit 20 is moved to mounting position 50 without any adjustment, the position of semiconductor chip carrier unit 20 is deviated from the one measured during the preparations that equals the thermal expansion of semiconductor chip carrier unit 20. Thus, it is necessary to adjust mounting position 50 of semiconductor chip carrier unit 20. Position adjustment instructions with respect to mounting position 50 set up during the preparations are given by CPU 75 to adjust the difference (i.e., the position deviation) between the picking-up position 40 of semiconductor chip carrier unit 20 during the preparations (i.e., the reference position) and that measured during the continuous mounting operations.

In accordance with the position adjustment instructions, arm 21 is moved (adjusted) in Y1-direction by semiconductor chip carrier unit 20 in order for collet 23 to come to the mounting position 50 of semiconductor chip carrier unit 20 set up during the preparations (Step S5). After such adjustment, semiconductor chip carrier unit 20 is moved to the mounting position 50 (Step S6).

Consequently, silicon chip 3 sucked and held by sucking member 24 of semiconductor chip carrier unit 20 is mounted on lead frame 31 in lead frame carrier unit 30. Here, since lead frame 31 is previously heated at a predetermined temperature, silicon chip 3 is fixed on lead frame 31 by an adhesive provided on the back of silicon chip 3 (Step S7).

Instead of previously heating lead frame 31 as set forth above, where an adhesive, such as silver (Ag) paste, is provided on the back of lead frame 31, silicon chip 3 may be fixed on lead frame 31 at a normal temperature.

Now, returning to the first step (Step S1), a next silicon chip 3 is picked up but, in this case, it is also necessary to adjust picking-up position 40 of semiconductor chip carrier unit 20 because the difference (position deviation) from the reference position is greater than the predetermined value. More concretely, position adjustment instructions are provided by CPU 75 to carry out a subtraction of the difference (position deviation) between the picking-up position 40 of semiconductor chip carrier unit 20 during the preparations obtained by CPU 75 and the picking-up position 40 (reference position) of semiconductor chip carrier unit 20 from movement data with respect to the reference position. In response to the instructions, arm 21 of semiconductor chip carrier unit 20 is moved back (adjusted) in Y1-direction in order for collet 23 of semiconductor chip carrier unit 20 to return to the picking-up position 40 during the preparations (Step S8).

Semiconductor chip carrier unit 20 is then returned to the picking-up position 40 (Step S1).

The adjustment order of picking-up position 40 of semiconductor chip carrier unit 20 and mounting position 50 is not limited to that described above but the adjustments may be carried out in any other steps, respectively, as far as the throughput of mounting operations is not substantially reduced.

As set forth above, in this embodiment of the chip mounting apparatus, picking-up position 40 of semiconductor chip carrier unit 20 is measured whenever a silicon chip 3 is picked up. The measured picking-up position 40 is compared with picking-up position 40 set up during the preparations for continuous mounting operations. Position deviation of picking-up position of semiconductor chip carrier unit 20 from mounting position 50 of semiconductor chip carrier unit 20 may result from thermal expansion occurring during the continuous mounting operations. Since the position deviation can be corrected, mounting position deviation of silicon chip 3 is substantially reduced while the throughput of the mounting operations are kept quite high.

SECOND EMBODIMENT

A semiconductor chip mounting apparatus of the second embodiment of the present invention will be explained below with reference to a flow chart of its mounting operations shown in FIG. 5. The semiconductor chip mounting apparatus of the first embodiment is used for that of this second embodiment but a step to check the number of mounting setting times is added to the former to make the throughput of mounting operations of the latter better than the former. In other words, the latter is the same as the former except for that step. Thus, the following explanation is primarily directed to operations of the added step.

Figure 5:
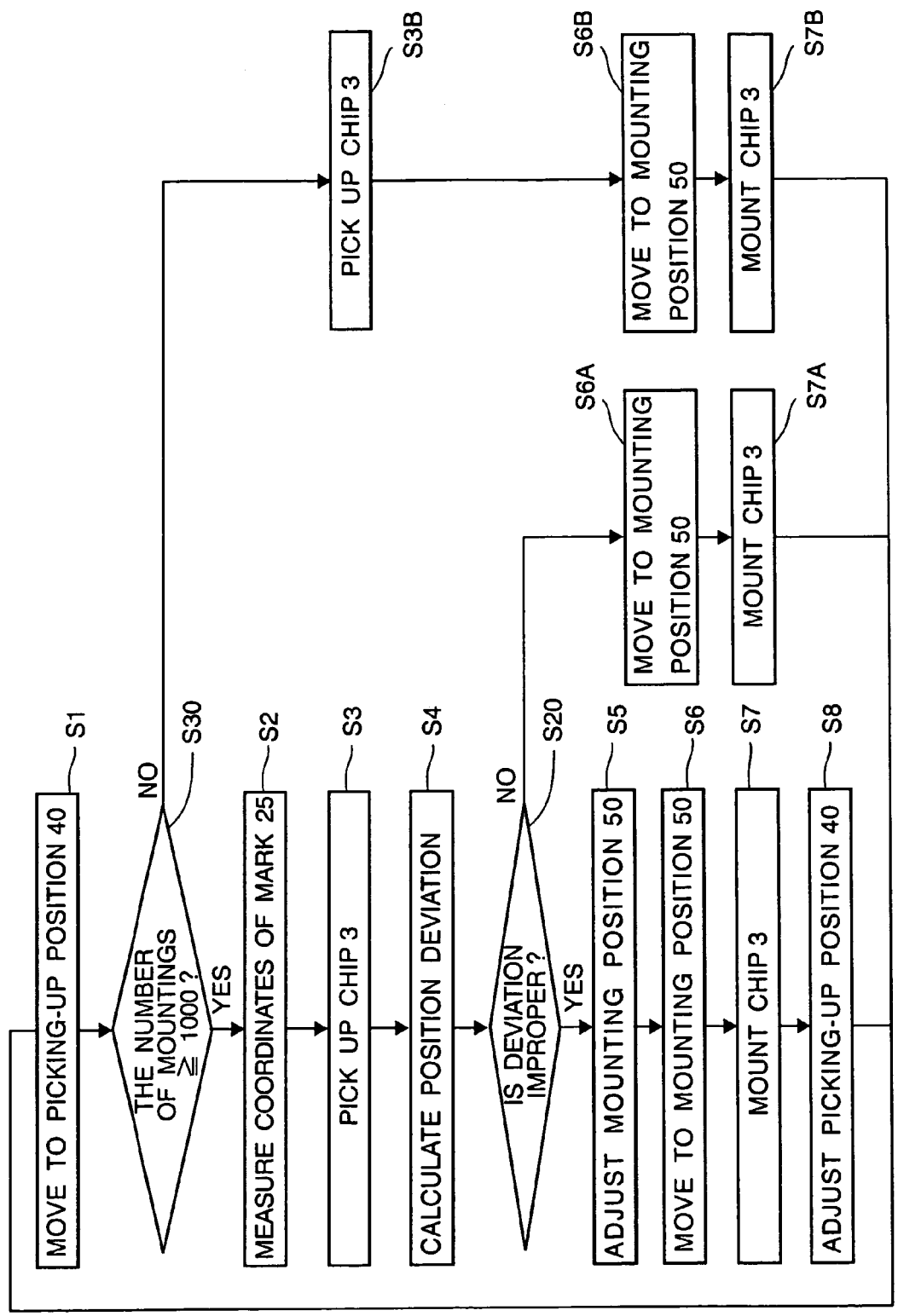
FIG. 5 is an operation flow chart of a semiconductor chip mounting apparatus in accordance with a second embodiment of the present invention.

As shown in FIG. 5, collet 23 of semiconductor chip carrier unit 20 is moved from origin 80 to picking-up position 40 (Step S1). The number of mounting operation times is, then, checked as to whether it is greater than the number of mounting setting times (Step S30). The number of mounting operation times is detected by a counter, not shown, and is transferred to, and stored in, control unit 70.

The check is performed by CPU 75 of control unit 70. Where the number of mounting operation times is less than the number of mounting setting times, e.g., 1,000, the step is advanced to the next one in response to instructions from CPU 75 of control unit 70. In the next step, silicon chip 3 is picked up by sucking member 24 of semiconductor chip carrier unit 20 (Step S3B). Then, semiconductor chip carrier unit 20 is moved to mounting position 50 (Step S6B) to carry silicon chip 3 to, and mount it on, lead frame 31 (Step S7B). Consequently, semiconductor chip carrier unit 20 is returned to the first step of picking-up position 40 (Step S1). This operation is repeated until the number of mounting operation times is counted to 999.

When the number of mounting operation times reaches 1,000, the step is further advanced to the next one in accordance with instructions from CPU 75 of control unit 70. In the next step, coordinates at a position of position measuring mark 25 of semiconductor chip carrier unit 20 are measured by displacement sensor 62 of displacement sensor unit 60 (Step S2). Since further steps including Step S2 are the same as in the first embodiment, their explanation is omitted here.

A counting step of the number of mounting operation times is started again from the beginning after the number of mounting operation times has reached that of the mounting setting times. Alternatively, the counting step could be continuously carried out so that the further steps including S2 are repeated every integer time of the number of mounting setting times. In short, the further steps are repeated at the number of mounting operation times of 2,000; 3,000; . . . or the like in the case that the number of mounting setting times is 1,000.

Where the picking-up position of semiconductor chip carrier unit 20 deviates more than a permissible value every count of 1,000 for the number of mounting operation times, picking-up and mounting positions 40 and 50 of semiconductor chip carrier unit 20 are consequently adjusted. In the event, however, that the picking-up position of semiconductor chip carrier unit 20 deviates within the permissible value, the number of continuous mounting operation times without any adjustment may be increased in response to instructions of CPU 75.

Conversely, where the picking-up of semiconductor chip carrier unit 20 deviates more than the permissible value, the number of continuous mounting operation times without any adjustment may be decreased in response to instructions of CPU 75 to comply with such mounting position deviations of silicon chip 3.

Instead of checking the number of mounting operation times to chose steps, other checking may be implemented regularly at a predetermined period of time, e.g., every five-minute period. Further, adjustments of picking-up and mounting positions 40 and 50 are not always limited to the steps set forth in the embodiments but they may be carried out in any other steps unless the throughput of mounting operations would be decreased as a result.

As set forth above, in the embodiments of the semiconductor chip mounting apparatus, picking-up position 40 of semiconductor chip carrier unit 20 is measured after silicon chips 3 are continuously mounted on a lead frame until a mounting setting time count is reached. The measured data of picking-up position 40 are compared with those measured during the preparations of mounting operations. Position deviations of picking-up and mounting positions 40 and 50 of semiconductor chip carrier unit 20 due to thermal expansion occurring during the continuous mounting operations are adjusted so that deviations of the mounting positions 50 of silicon chips 3 can be reduced. In addition, the time required for mounting operations of silicon chips 3 may be shorter than in the first embodiment.

The deviations of the mounting positions of silicon chips 3 can be significantly reduced while the high throughput of mounting operations is achieved.

THIRD EMBODIMENT

A semiconductor chip mounting apparatus of the third embodiment in accordance with the present invention will be explained below with reference to a perspective view of the semiconductor chip mounting apparatus and its flow chart shown in FIGS. 6 and 7, respectively, in addition to FIG. 2.

Figure 6:
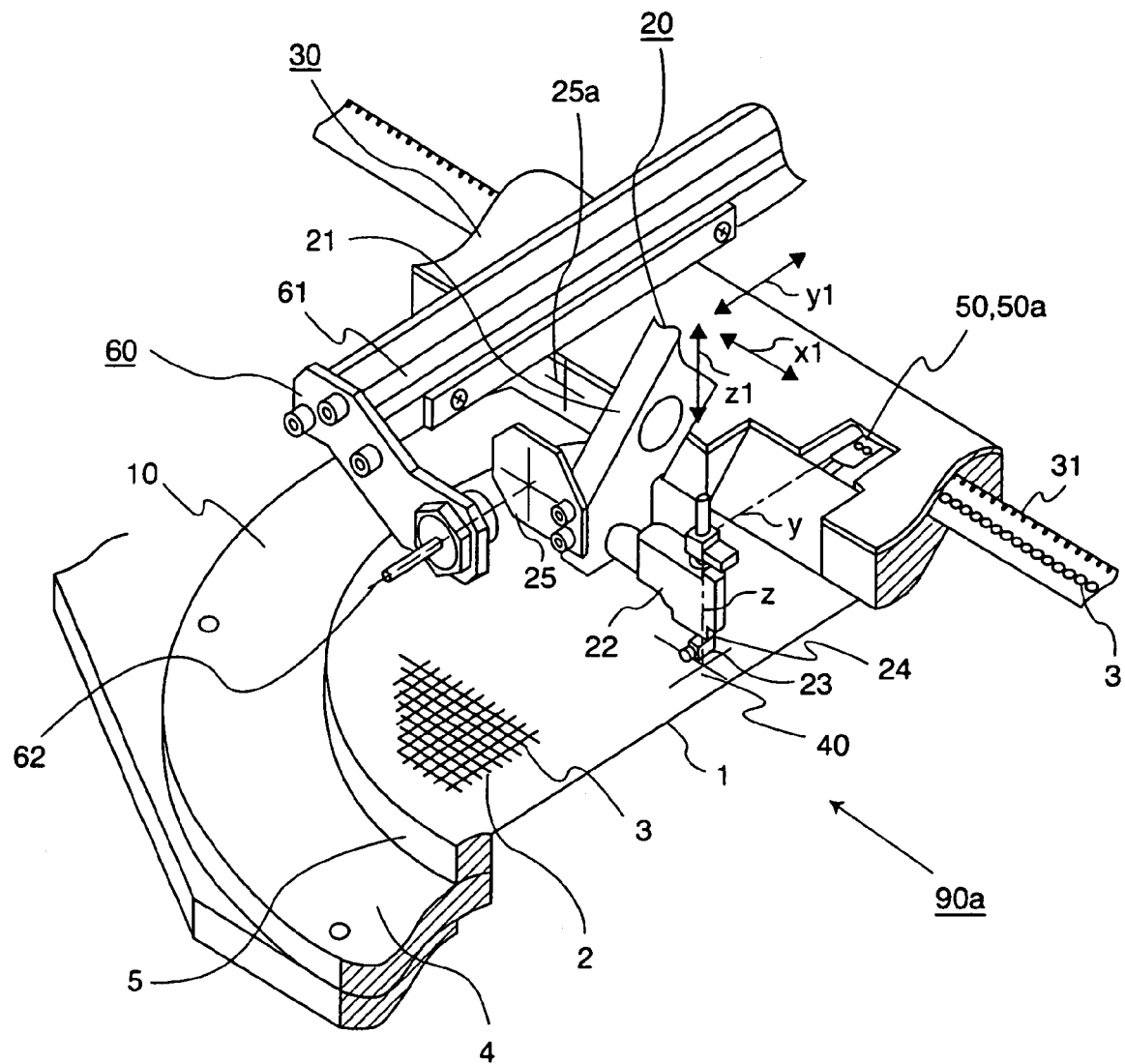
FIG. 6 is a perspective view of a semiconductor chip mounting apparatus in accordance with a third embodiment of the present invention.

As shown in FIG. 6, the semiconductor chip mounting apparatus is the same as the first embodiment except for adding a position measuring mark 25*a* to the latter. The main differences in structure between this embodiment and the first one are explained below.

Again, as shown in FIGS. 2 and 6, the semiconductor chip mounting apparatus 90*a* of this embodiment includes semiconductor chip supply unit 10, semiconductor chip carrier unit 20, lead frame carrier unit 30, sensor unit 60 and control unit 70.

Lead frame carrier unit 30 is provided with a position measuring mark 25*a* for sensor unit 60 to measure position deviations of lead frame carrier unit 30 due to mechanical abrasion and thermal expansion resulting from continuous carrying of lead frame 31 and heating lead frame carrier unit 30, respectively. Silicon chips 3 are carried to, and mounted on, lead frame 31, which is, in turn, carried to a next step (bonding step).

Sensor unit 60 is provided with displacement sensor 62 and sensor holder 61 to measure positions of position measuring marks 25 and 25a of semiconductor chip carrier unit 20 and lead frame carrier unit 30, respectively.

In preparations of continuous mounting operations (before the commencement of continuous mounting operations), not shown, wafer ring 5 holding dicing sheet 1 is held by supporting member 4, picking-up position 40 of semiconductor chip carrier unit 20 and mounting position 50a of lead frame carrier unit 30 are measured with displacement sensor 62, and such measured data are stored in memory 74. Continuous mounting operations are commenced on completion of the preparations.

Although, here, picking-up position 40 of semiconductor chip carrier unit 20 and mounting position 50a of lead frame carrier unit 30 are measured with displacement sensor 62, separate sensors may be provided for measurement of those data.

Figure 7:
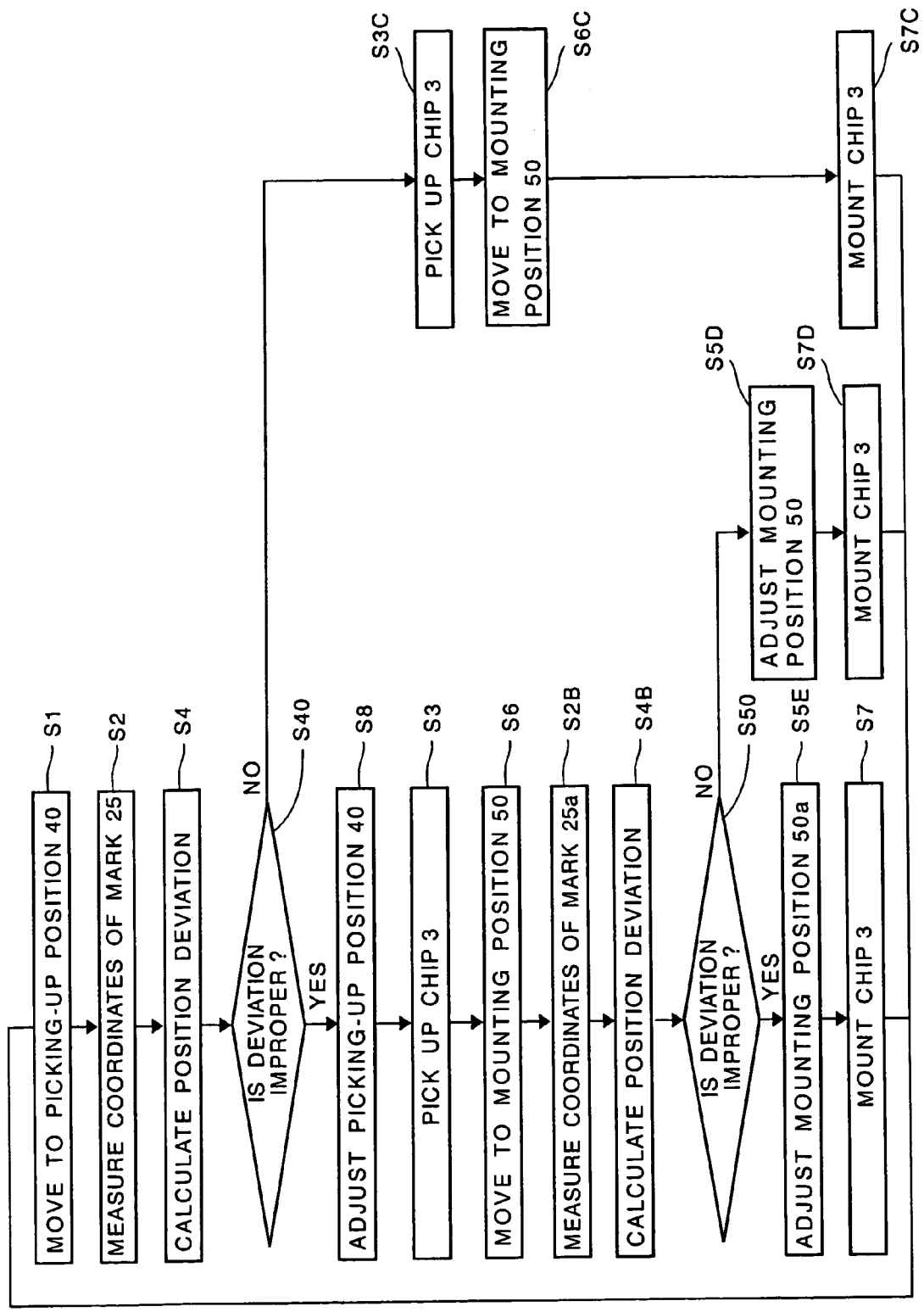
FIG. 7 is an operation flow chart of the semiconductor chip mounting apparatus shown in FIG. 6.

As shown in FIG. 7, collet 23 of semiconductor chip carrier unit 20 is moved from the origin 80 to picking-up position 40 (Step S1). In this situation, coordinates at a position of position measuring mark 25 of semiconductor chip carrier unit 20 are measured with displacement sensor 62 of displacement sensor unit 60 (Step S2).

Next, measured data of picking-up position 40 are compared with those of the reference position, i.e., picking-up position 40 of semiconductor chip carrier unit 20 during the preparations and differences between them are calculated by CPU 75 of control unit 70 (Step S4). It is checked whether the differences from the reference position (deviations from the correct picking-up position) are greater than a predetermined value or not (Step S40).

Where the difference is less than the predetermined value, no adjustment of the mounting position 50 is made but silicon chip 3 is picked up by sucking member 24 of semiconductor chip carrier unit 20 (Step S3C). Semiconductor chip carrier unit 20 is, then, moved to mounting position 50 (Step S6C) and silicon chip 3 is mounted on lead frame 31 (Step S7C).

Where, on the other hand, the differences (position deviations) from the reference position are greater than the predetermined value, picking-up position 40 is adjusted. More concretely, position adjustment instructions provided by CPU 75 contain data of the reference position, i.e., picking-up position 40 of semiconductor chip carrier unit 20 measured during the preparations, and position deviation, and instructions to adjust the former to commence for and by the value of the latter. In response to the instructions, the adjustment is carried out for picking-up position 40 of semiconductor chip carrier unit 20 (Step S8).

Next, silicon chip 3 is sucked and held, i.e., picked up by sucking member 24 (Step S3). Semiconductor chip carrier unit 20 is moved to mounting position 50 (Step S6). Coordinates of position measuring mark 25a of lead frame carrier unit 30 are measured with displacement sensor 62 of displacement sensor unit 60 (Step S2B).

Although the coordinates of position measuring mark 25a as well as those of picking-up position 40 of semiconductor chip carrier unit 20 during the preparations and those of mounting position 50a of lead frame carrier unit 30 are measured with displacement sensor 62, separate additional sensors may be provided for measurement of those data, respectively.

The measured data of mounting position 50 are compared with those of mounting position 50 during the preparations (reference position A) and a difference between them is calculated by CPU 75 of control unit 70 (Step S4B).

It is checked whether the differences from the reference position (mounting position deviation) as a result of the calculation are greater than a predetermined value or not (Step S50).

In the event that the mounting position deviations are within the predetermined value, position deviations only caused by thermal expansion of semiconductor chip carrier unit 20 are subject to adjustment. More concretely, position adjustment instructions provided by CPU 75 contain position deviation data of the picking-up position 40 of semiconductor chip carrier unit 20 during the continuous mounting operations from the picking-up position 40 of semiconductor chip carrier unit 20 during the preparations obtained by CPU 75 (reference position) and an instruction to adjust the reference position in accordance with the position deviation data. In response to the instructions, mounting position 50 of semiconductor chip carrier unit 20 is adjusted (Step S5D).

Consequently, silicon chip 3 sucked and held by sucking member 24 of semiconductor chip carrier unit 20 is mounted on lead frame 31 of lead frame carrier unit 30. Since lead frame 31 is previously heated at a predetermined temperature, silicon chip 3 is fixed on lead frame 31 by an adhesive provided on the back of silicon chip 3 (Step S7D).

In stead of previously heating lead frame 31 as set forth above, where an adhesive, such as silver (Ag) paste, is provided on the back of lead frame 31, silicon chip 3 may be fixed on lead frame 31 at a normal temperature.

Where, on the other hand, the position deviations from the reference position are greater than the predetermined value, mounting position 50 of semiconductor chip carrier unit 20 is adjusted in consideration of position deviations of semiconductor chip carrier unit 20 and lead frame carrier unit 30 caused by continuous mounting operations of silicon chips 3. More concretely, CPU 75 adds position deviation data of lead frame carrier unit 30 to those of semiconductor chip carrier unit 20. CPU 75 also provides semiconductor chip carrier unit 20 with instructions of position adjustment to move its mounting position 50 by the added deviation data. In response to the instructions, the adjustment is carried out for picking-up position 40 of semiconductor chip carrier unit 20 (Step S5E).

Consequently, silicon chip 3, which is sucked and held by sucking member 24 of semiconductor chip carrier unit 20, is mounted on lead frame 31 of lead frame carrier unit 30 (Step S7).

Semiconductor chip carrier unit 20 is then moved to picking-up position 40 as in the first operation (Step S1)

Adjustments of picking-up position 40 of semiconductor chip carrier unit 20 and mounting position 50 are not always limited to the ones described above but they may be performed in any other steps as far as the throughput of mounting operations is not substantially reduced as a result.

As set forth above, in the present embodiments of the semiconductor chip mounting apparatus, picking-up position 40 of semiconductor chip carrier unit 20 is measured whenever silicon chip 3 is picked up. The measured picking-up position is compared with the picking-up position 40 before the mounting operations to obtain position deviations of picking-up position 40 of semiconductor chip carrier unit 20 due to thermal expansion occurring during the continuous mounting operations. Such position deviations are adjusted in response to instructions by CPU 75.

Further, mounting position 50a of lead frame carrier unit 30 is measured whenever silicon chip 3 is mounted. The measured mounting position 50a is compared with the mounting position 50a before the mounting operations. Position deviations of lead frame carrier unit 30 due to frictional abrasion occurring during the continuously carrying of lead frame 31 and thermal expansion resulting from heating lead frame 31 are added to those of semiconductor chip carrier unit 20 due to a thermal expansion occurred during the continuous mounting operations by CPU 75. Position adjustment instructions are launched in accordance with the added position deviations by CPU 75. Mounting position 50 of semiconductor chip carrier unit 20 can be eventually adjusted in response to the position adjustment instructions.

Thus, deviations of the mounting positions of silicon chips 3 can be reduced more than in the first embodiment.

FOURTH EMBODIMENT

Next, operations of a semiconductor chip mounting apparatus of the fourth embodiment in accordance with the present invention will be explained below with reference to a flow chart of the operations shown in FIG. 8. In this embodiment, the semiconductor chip mounting apparatus of the third embodiment is used but a step for verification of the number of mounting setting times is added to the third embodiment to make the throughput of mounting operations higher than in the previous one. Structures and operations of this fourth embodiment are substantially the same as the third one except for the above mentioned feature so that different aspects will be primarily set forth below.

Figure 8:
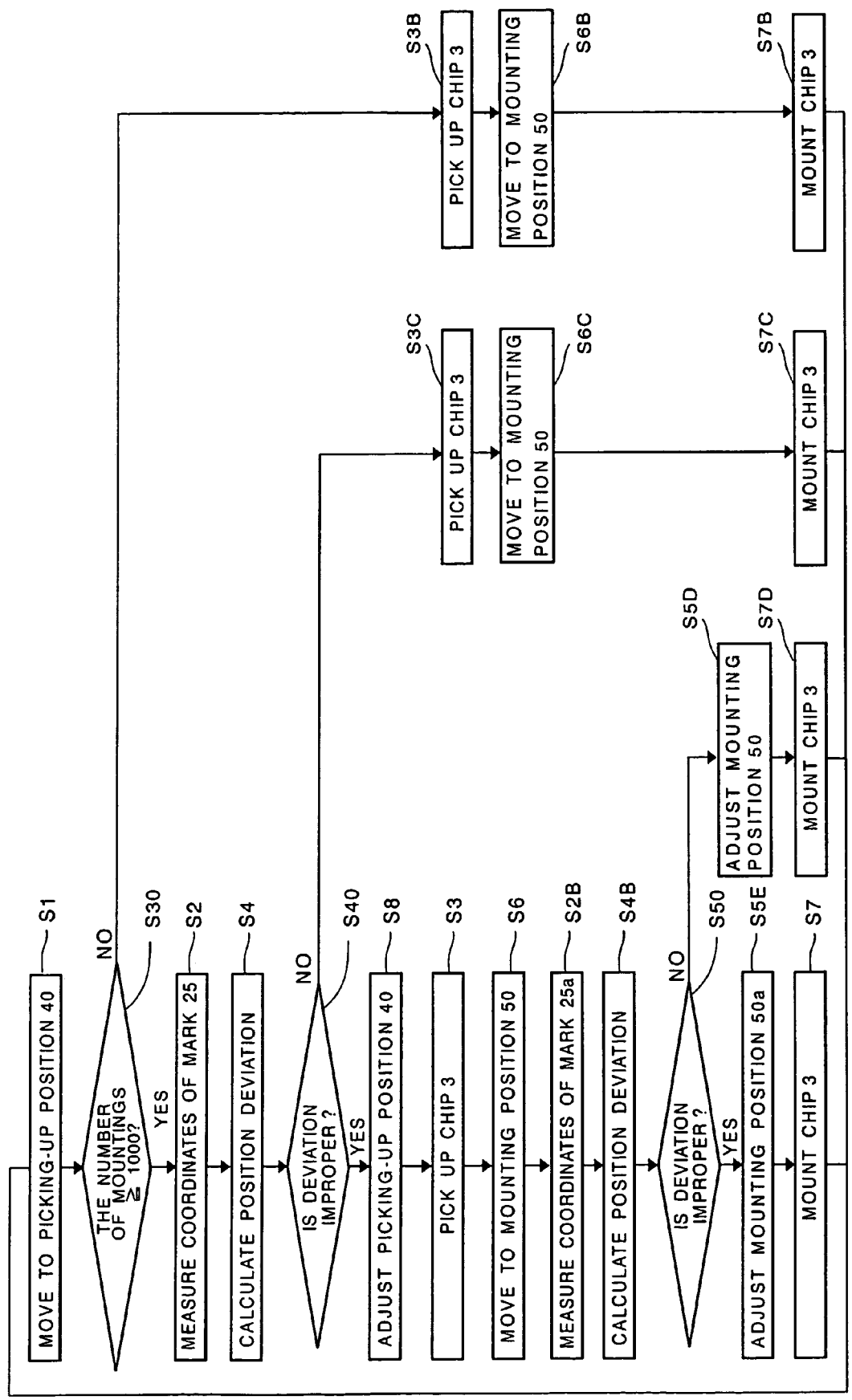
FIG. 8 is an operation flow chart of a semiconductor chip mounting apparatus in accordance with a fourth embodiment of the present invention.
Figure 9:
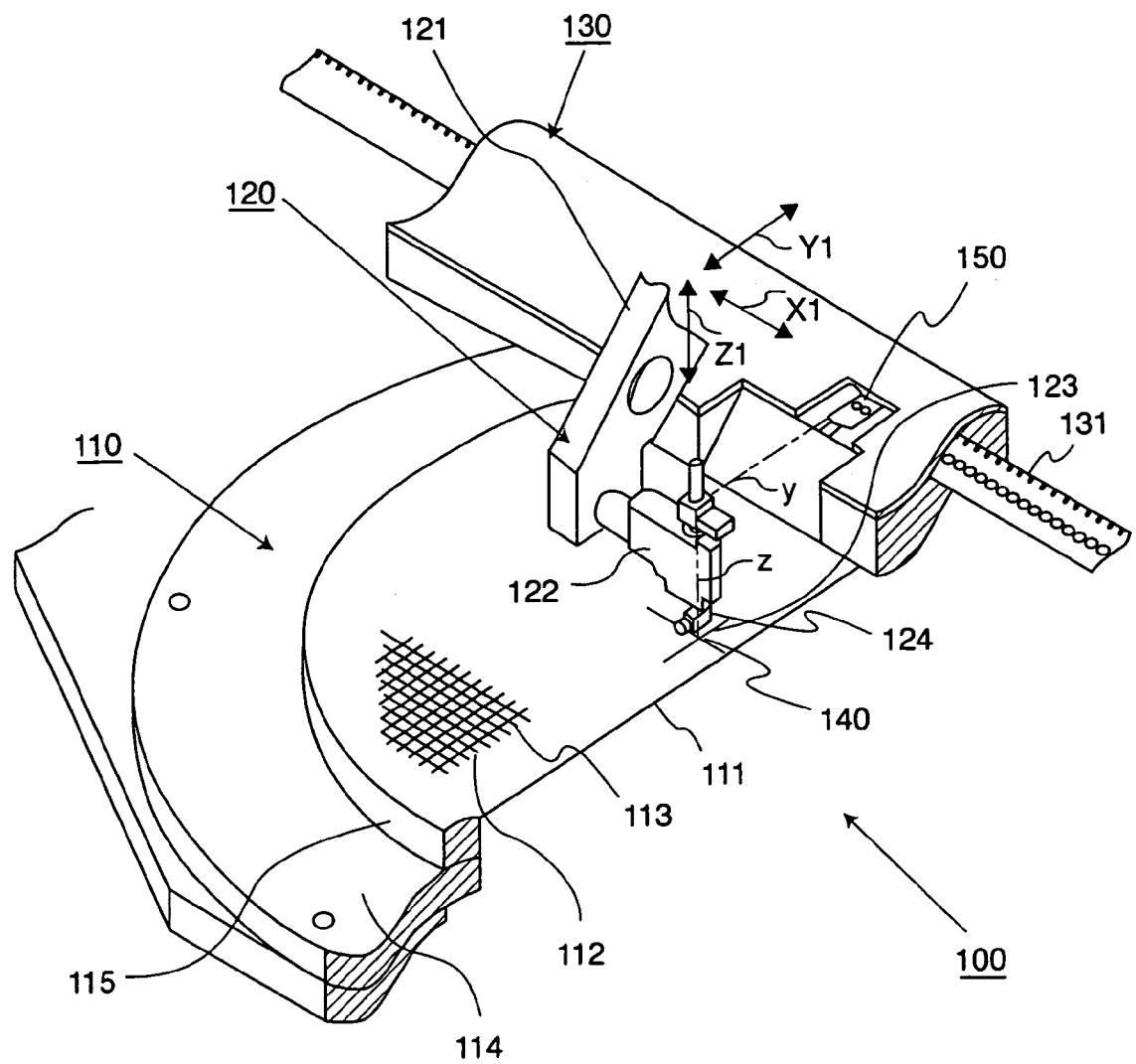
FIG. 9 is a perspective view of a prior art semiconductor chip mounting apparatus.
Figure 10:
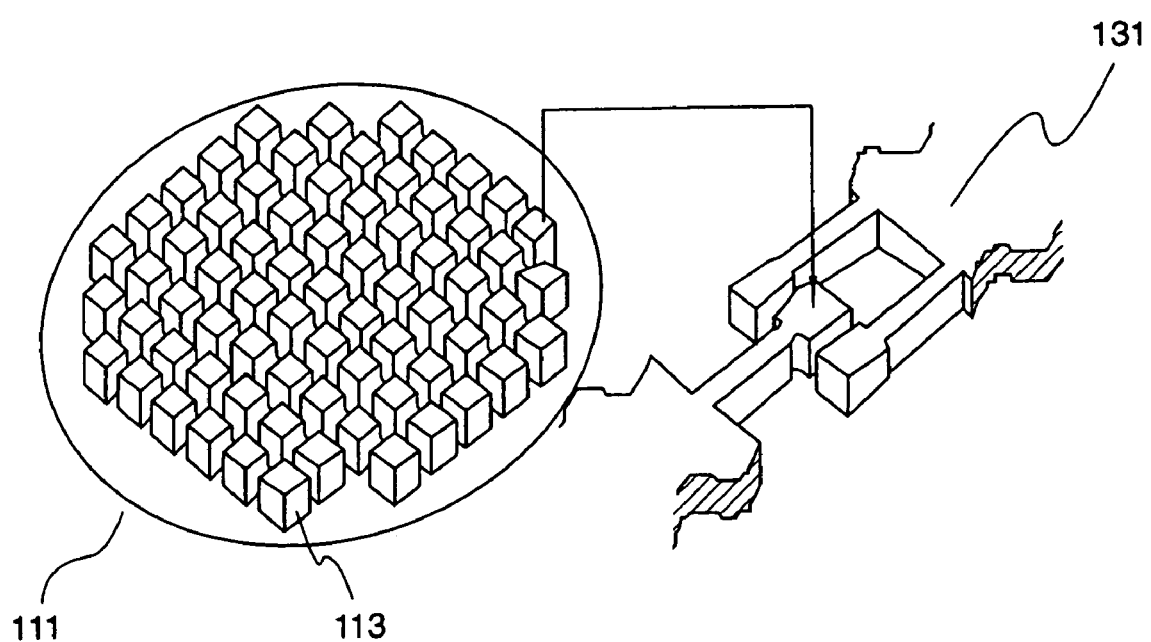
FIG. 10 is a schematic perspective view to explain picking-up, carrying and mounting operations of the prior art semiconductor chip mounting apparatus.
Figure 11:
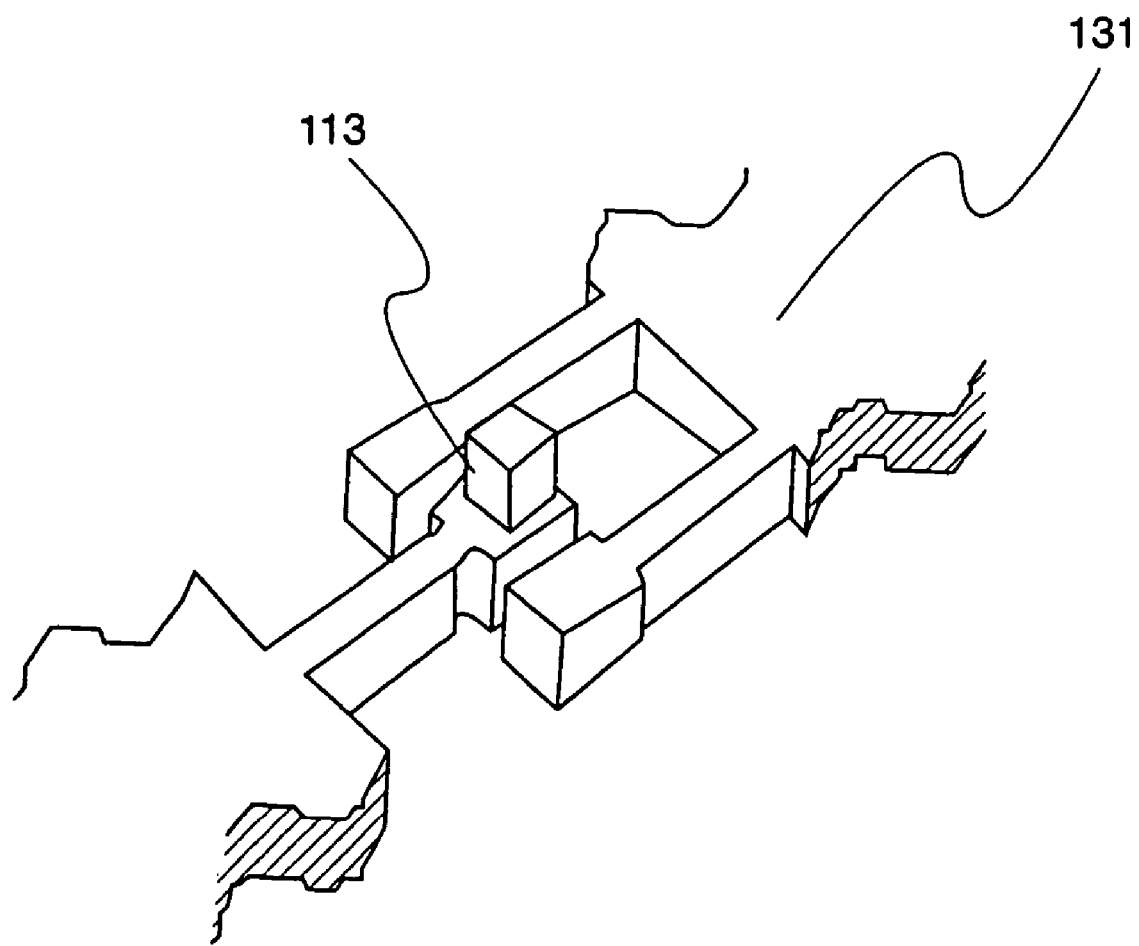
FIG. 11 is a schematic perspective view to explain a completed status of mounting operations in the prior art semiconductor chip mounting apparatus.

As shown in the operation flow chart of FIG. 8, collet 23 of semiconductor chip carrier unit 20 is moved from the origin 80 to picking-up position 40 (Step S1). It is, then, checked whether the number of mounting operation times is more than that of mounting setting times or not (Step S30). The number of mounting operation times is detected by a counter, not shown, and is transferred to, and stored in, control unit 70.

The number of mounting operation times is checked by CPU 75 of control unit 70. Where it is less than that of mounting setting times, e.g., less than 1,000, the step is advanced to the next one in response to instructions from CPU 75 of control unit 70. In the next step, silicon chip 3 is picked up by sucking member 24 of semiconductor chip carrier unit 20 (Step S3B). Then, semiconductor chip carrier unit 20 is moved to mounting position 50 (Step S6B) and mounts silicon chip 3 on lead frame 31 (Step S7B). Consequently, semiconductor chip carrier unit 20 is returned to the first step of picking-up position 40 (Step S1). This operation is repeated until the number of mounting operation times is counted to 999.

When the number of mounting operation times reaches 1,000, the step is further advanced to the next one in accordance with instructions from CPU 75 of control unit 70. In the next step, coordinates at a position of position measuring mark 25 of semiconductor chip carrier unit 20 are measured by displacement sensor 62 of displacement sensor unit 60 (Step S2). Since further steps including Step S2 are substantially the same as in the third embodiment, their explanation is omitted here.

A counting step of the number of mounting operation times is started again from the beginning after the number of mounting operation times has reached the mounting setting times. Alternatively, the counting step is continuously carried out so that the further steps including S2 are repeated every integer time of the number of mounting setting times. In short, the further steps are repeated at the number of mounting operation times of 2,000; 3,000; . . . ; or the like in the case that the number of mounting setting times is 1,000.

Where the picking-up position of semiconductor chip carrier unit 20 deviates more than a permissible value every count of 1,000 for the number of mounting operation times, picking-up and mounting positions 40 of semiconductor chip carrier unit 20 are consequently adjusted. In the event, however, that the picking-up position of semiconductor chip carrier unit 20 deviates within the permissible value, the number of continuous mounting operation times without any adjustment may be increased in response to instructions of CPU 75.

Conversely, where the picking-up of semiconductor chip carrier unit 20 deviates more than the permissible value, the number of continuous mounting operation times without any adjustment may be decreased in response to instructions of CPU 75 to comply with mounting position deviations of silicon chip 3.

Instead of checking the number of mounting operation times to chose steps, other checking may be done regularly at a period of time, e.g., every five-minute period. Further, adjustments of picking-up and mounting positions 40 and 50 are not always limited to the steps set forth in this embodiment but they may be carried out in any other steps unless the throughput of mounting operations would be decreased as a result.

As set forth above, in the present embodiments of the semiconductor chip mounting apparatus, silicon chips 3 are mounted on lead frame 31 and picking-up position 40 of semiconductor chip carrier unit 20 is measured. The measured data are compared with those measured before the mounting operations. Thus, position deviations of mounting position 40 of semiconductor chip carrier unit 20 due to thermal expansion occurring during the continuous mounting operations are adjusted.

Further, mounting position 50a of lead frame carrier unit 30 is measured to compare the mounting position 50a before the mounting operations. Position deviations of lead frame carrier unit 30 due to frictional abrasion occurring during the continuously carrying of lead frame 31 and thermal expansion resulting from heating lead frame 31 are added to those of semiconductor chip carrier unit 20 due to a thermal expansion occurring during the continuous mounting operations in response to instructions of CPU 75. Position adjustment instructions are launched in accordance with the added position deviations by CPU 75. Mounting position 50 of semiconductor chip carrier unit 20 can be eventually adjusted in response to the position adjustment instructions. Thus, the mounting operations of the present embodiment can be carried out in a much shorter time than those of the third embodiment.

Position deviations from the mounting position of silicon chips 3 of this embodiment may be reduced better, and its throughput of mounting operations is kept higher than those of the prior art semiconductor chip mounting apparatus.

The present invention is not limited to the embodiments but may be modified to other specific structures without departing from its spirit or essential characteristics.

Although position adjustments of the embodiments, for instance, are made in such way that position deviations of picking-up position 40 of semiconductor chip carrier unit 20 are added to the picking-up position of semiconductor chip carrier unit 20 set in advance, semiconductor chip supply unit 10 may be shifted by the position deviations. In other words, semiconductor chip supply unit 10 may be moved to the deviated picking-up position, by the utilization of which a next semiconductor chip can be mounted.

In the semiconductor chip apparatus set forth above as one embodiment, semiconductor chip carrier unit 20 is moved only in the horizontal direction (Y1) parallel to the direction of arm 21 moving from picking-up position 40 to mounting position 50 and in the vertical direction (Z1) to pick up and mount silicon chips 3. In addition, its operations are explained in the case that position deviations of picking-up and mounting positions 40 and 50 of semiconductor chip carrier unit 20 are almost the same. The present invention, however, is applicable to a different semiconductor chip mounting apparatus that carries out rotating operations when it moves from picking-up position 40 to mounting position 50, for instance. In this case, since position deviations of picking-up and mounting positions 40 and 50 are different from each other. Thus, mounting positions 50 before and during mounting operations are measured to obtain a position difference between them. Then, mounting position 50 of semiconductor chip carrier unit 20 is adjusted to the mounting position 50 set in advance by the position differences (mounting position deviations).

Further, in the embodiments, silicon chips are mounted on a lead frame. The present invention, however, is applicable to a semiconductor chip mounting apparatus in which chips are mounted on other mounted members than a lead frame, such as lead terminals, big chips of different kinds, or the like.

The present invention can provide a semiconductor chip mounting apparatus capable of high throughput mounting operations and a method of mounting using the same.

What is claimed is:

1. A semiconductor chip mounting apparatus comprising:
   a semiconductor chip supply unit to supply a semiconductor chip;
   a mounting member carrier unit to carry a mounting member;
   a semiconductor chip carrier unit to carry out mounting operations, wherein said mounting operations include picking up said semiconductor chip from said semiconductor chip supply unit, carrying said semiconductor chip to a mounting position of said mounting member, and mounting said semiconductor chip on said mounting position of said semiconductor chip carrier unit;
   a sensor unit to measure first and second positions of said semiconductor chip carrier unit before and during said mounting operations, respectively, wherein said sensor unit measures said second position of said semiconductor chip carrier unit when said semiconductor chip carrier unit carries out semiconductor chip mounting operations at predetermined times;
   a control unit to calculate position deviations of said first position of said semiconductor chip carrier unit from said second position of said semiconductor chip carrier unit to provide position adjustment instructions when said position deviations are greater than a predetermined value; and
   an adjustment unit configured to adjust said second position of said semiconductor chip carrier unit in response to said position adjustment instructions of said control unit.

2. A semiconductor chip mounting apparatus comprising:
   a semiconductor chip supply unit to supply a semiconductor chip;
   a lead frame carrier unit to carry a lead frame;
   a semiconductor chip carrier unit to carry out semiconductor chip mounting operation, wherein said semiconductor chip mounting operations include picking up said semiconductor chip from said semiconductor chip supply unit, carrying said semiconductor chip to a mounting position of said lead frame, and mounting said semiconductor chip on said mounting position;
   a sensor unit to measure first and second positions of said semiconductor chip carrier unit before and during said mounting operation, respectively, wherein said sensor unit measures said second position of said semiconductor chip carrier unit when said semiconductor chip carrier unit carries out semiconductor chip mounting operations at predetermined times;
   a control unit to calculate position deviations of said first position of said semiconductor chip carrier unit from said second position of said semiconductor chip carrier unit to provide position adjustment instructions where said position deviations are greater than a predetermined value; and
   an adjustment unit configured to adjust said second position of said semiconductor chip carrier unit in response to said position adjustment instructions of said control unit.

3. A semiconductor chip mounting apparatus according to claim 2, wherein said predetermined times are increased if said position deviations are less than said predetermined value, or decreased if said position deviations are greater than said predetermined value.

4. A semiconductor chip mounting apparatus comprising:
   a semiconductor carrier unit to carry a lead frame;
   a semiconductor chip carrier unit to pick up said semiconductor chip from said semiconductor chip supply unit, to carry said semiconductor chip to a mounting position of said lead frame, and to mount said semiconductor chip on said mounting position;
   a sensor unit to measure data of said picking up position of said semiconductor chip carrier unit and data of said mounting position of said lead frame carrier unit, wherein said sensor unit measures said picking-up position of said semiconductor chip carrier unit and said mounting position of said lead frame carrier unit when said semiconductor chip mounting operations are carried out at predetermined times;
   a control unit to provide position adjustment instruction, wherein said control unit calculates picking-up position deviations of said data of said picking-up position measured by said sensor unit before semiconductor chip mounting operations from those during said semiconductor chip mounting operations and said semiconductor chip mounting operation and said position adjustment instructions are provided when said picking-up position adjustment instruction are provided when said picking-up position deviation are greater than a predetermined value, and wherein said control unit calculates mounting position deviations of said data of said mounting position measured by said sensor unit before semiconductor chip mounting operations from those measured by said sensor unit during said semiconductor chip mounting operation and said position adjustment instructions are also provided when said mounting position deviations are greater than a predetermined value; and
   an adjustment unit configured to adjust said picking-up and mounting position of said semiconductor chip carrier unit in response to said position adjustment instructions from said control unit.

5. A semiconductor chip mounting apparatus comprising:

a semiconductor chip supply unit to supply a semiconductor chip;

a lead frame carrier unit to carry a lead frame;

a semiconductor chip carrier unit to pick up said semiconductor chip from said semiconductor chip supply unit, to carry said semiconductor chip to a mounting position of said lead frame, and to mount said semiconductor chip on said mounting position;

a sensor unit to measure data of a first position of said semiconductor chip carrier unit before mounting operations and those of a second position of said semiconductor chip carrier unit during said mounting operations, respectively, wherein said sensor unit measures said second position of said semiconductor chip carrier unit when said semiconductor chip carrier unit carries out semiconductor chip mounting operations at predetermined times;

a control unit to provide position adjustment instructions, wherein said control unit calculates position deviations of said first position of said semiconductor chip carrier unit from said second position of said semiconductor chip carrier unit and said position adjustment instructions are directed to either a position of said semiconductor chip supply unit or that of said semiconductor chip carrier unit when said position deviations are greater than a predetermined value; and an adjustment unit configured to return said semiconductor chip supply unit to a first semiconductor supply position or said semiconductor chip carrier unit to said first picking-up position in response to said position adjustment instructions from said control unit.

* * * * *